United States Patent [19]

Naiff

[11] Patent Number: 4,545,033
[45] Date of Patent: Oct. 1, 1985

[54] COMPACT ROM WITH REDUCED ACCESS TIME

[75] Inventor: Kenneth L. Naiff, Hauppauge, N.Y.

[73] Assignee: General Instrument Corp., New York, N.Y.

[21] Appl. No.: 527,087

[22] Filed: Aug. 29, 1983

Related U.S. Application Data

[63] Continuation-in-part of Ser. No. 383,709, Jun. 1, 1982, Pat. No. 4,480,320.

[51] Int. Cl.$^4$ ............................................ G11C 11/40
[52] U.S. Cl. ....................................... 365/51; 365/203
[58] Field of Search ................ 365/51, 104, 203, 174, 365/182

[56] References Cited

U.S. PATENT DOCUMENTS 4,480,320  10/1984  Naiff .................................... 365/189

OTHER PUBLICATIONS

IEEE Journal of Solid State Circuits, vol. SC11, No. 3, Title "Minimum Size ROM Structure Compatible with Silicon-Gate E/D MOS LSI", by Kawagoe et al.

Primary Examiner—Terrell W. Fears
Attorney, Agent, or Firm—James & Franklin

[57] ABSTRACT

The number of contact holes is reduced by fabricating the column select decode circuit as part of the array. The decode circuit includes four tiers of alternately arranged depletion mode and enhancement mode transistors, each tier receiving a different column address signal. The appropriate combination of signals connects a column of series connected driver transistors to the precharged control terminal of an isolation transistor. The output circuit of the isolation transistor is connected between the output line and ground. If all the driver transistors in the selected column are rendered conductive, the isolation transistor becomes non-conductive, permitting the output line to charge to a positive level.

11 Claims, 5 Drawing Figures

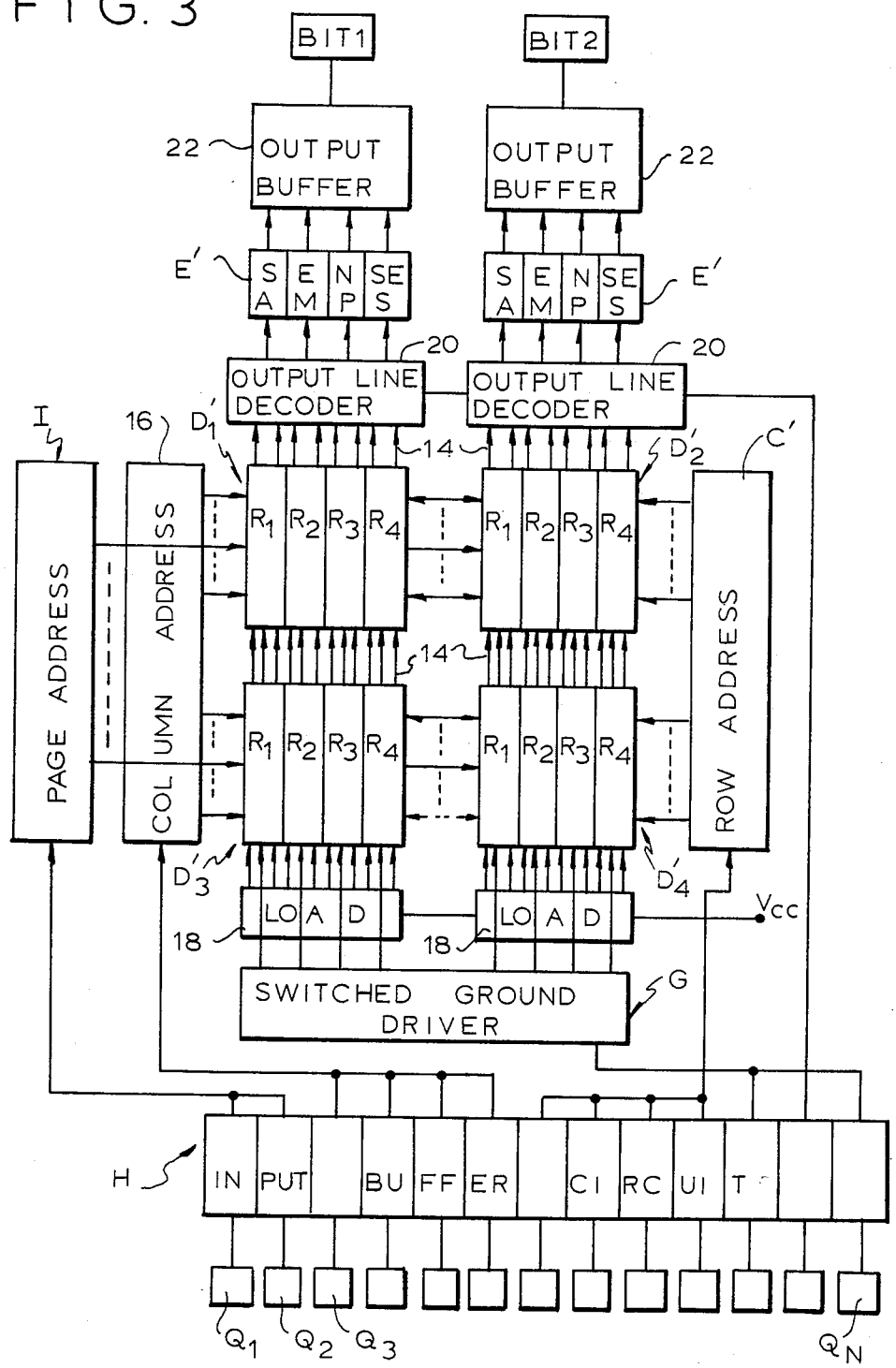

COMPACT ROM WITH REDUCED ACCESS TIME

This application is a continuation-in-part of my prior co-pending U.S. application Ser. No. 383,709, filed June 1, 1982, now U.S. Pat. No. 4,480,320, and having the same title.

The present invention relates to read only memories (ROMs) and, more particularly, to a serial stack read only memory with reduced access time which can be fabricated in a highly compact manner.

A read only memory is an electronic information storage device. Unlike erasable memories, a read only memory is fabricated to contain information which is defined by the structure of the memory and, thus, the information therein cannot be altered. Such a memory has the advantage of retaining the stored information therein without the necessity of periodic refreshing. In the event of a power disruption, the information contained in the memory is therefore not lost.

As with other types of electronic memories, it is desirable to fabricate a read only memory to maximize the amount of information which can be stored on a given area on a chip. Thus, fabrication techniques have been developed to increase the number of memory units per given area and enhance the density of the memory.

For example, silicon gate technology utilizing a self-aligned gate structure has reduced the space required on the chip by about 20%–30%, as compared with memories employing aluminum gate metal oxide semiconductor transistors. For this reason, read only memories employing silicon gate fabrication techniques are currently widely used.

In the *I.E.E.E. Journal of Solid-State Circuits* of June 1976, Hiroto Kawagoe and Nobuhiro Tsuji published an article entitled "Minimum Size ROM Structure Compatible With Silicon-Gate E/D MOS LSI", in which a new read only memory structure was disclosed. In the new structure, a cascade ratioless circuit configuration is used. The content of a memory cell is determined by the choice of the transistor threshold mode, that is, either enhancement or depletion, as contrasted to the conventional read only memory structure where the content of a memory cell is distinguished by the existence or absence of an operable transistor. The authors claim that this fabrication technique can reduce the size of the read only memory by 45%, as compared to conventional silicon gate read only memories.

The conventional read only memory consists of a plurality of flip-flop circuits, address decoders, and a matrix array of memory units. The flip-flop circuits are utilized to hold an address in the memory unit matrix with a binary code. The address decoders are utilized to select the row and column of the particular memory unit which is to be read.

Each of the conventional-type memory columns consists of a plurality of memory units which are connected in parallel. The state of each memory unit is distinguished by the existence or absence of an operable transistor. If P channel metal oxide semiconductor transistors are used, the signal read-out is performed by applying a low level signal (near the negative power supply voltage) to the selected address line. A high level signal (nearly zero volts) is applied to all of the non-selected address lines.

If the selected transistor is nonoperable, that is, has a thick gate oxide, the application of the low level signal to the control terminal thereof will not render the transistor conductive and, thus, a precharged output node will not be discharged. On the other hand, if a functioning transistor has been selected, that is, one with a thin gate oxide, the application of the address signal to the control terminal thereof will render the transistor conductive, thereby discharging the pre-charged output node. Thus, whether the output node is discharged or not indicates whether an operable transistor existed at the addressed location.

The Kawagoe/Tsuji read only memory structure disclosed in the article uses both enhancement mode and depletion mode transistors for the memory units. Design and fabrication are simplified because no through holes are required. The size of a single bit of the memory is substantially reduced and the necessity for an aluminum layer in the matrix is eliminated.

The Kawagoe/Tsuji read only memory uses a cascade ratioless circuit configuration which consists of enhancement mode and depletion mode silicon gate semiconductor transistors, connected in series as driver elements to form a stack, instead of the conventional parallel configuration. The depletion mode transistors act as resistors between the enhancement mode transistors. The mode of the transistor, that is, whether same is enhancement or depletion, is selected in accordance with the information to be defined at the location of the particular transistor. Because of this arrangement, the structure of the chip is significantly simplified and, thus, the size of the random access memory is greatly reduced.

While the read only memory structure proposed by Kawagoe and Tsuji is a significant improvement over the conventional silicon gate read only memory, it has a significant drawback. In order to obtain a memory of reasonable size, each stack must be relatively long. The large number of series connected driver transistors form a circuit with a relatively high impedance. When this high impedance circuit is connected directly to a high capacitive load, as it is in the Kawagoe/Tsuji read only memory, a relatively high discharge time results. In the example in the article, each stack comprises 48 silicon gate semiconductor driver transistors connected in series. This circuit is directly connected to drive a load of approximately 1.5 pF, resulting in a delay time of approximately 2 microseconds.

In view of this, it can be readily appreciated that there is a direct relationship in the Kawagoe/Tsuji memory between the number of series connected transistors in the stack and the memory delay time. As the number of transistors in the stack increases, so does the delay time. Thus, it would be a significant achievement if this relationship could be circumvented because larger memories would result with no sacrifice in response time.

This relationship is circumvented in the present invention through the use of an isolation transistor, interposed between the series connected driver transistors and the output node. The control node of the isolation transistor is connected to the series connected drivers. The output circuit is connected between ground and the output node. The output node is connected through a load to a source.

Prior to addressing, the control node of the isolation transistor is precharged to render the isolation transistor conductive. If all of the transistors in the stack are rendered conductive when addressed, the control node of the isolation transistor is grounded through the drivers, thereby dissipating the precharge, the isolation transistor is rendered non-conductive and the output node remains charged. Otherwise, the isolation transistor remains conductive and the output node is rapidly discharged to ground through the output circuit of the isolation transistor.

With this system, the time it takes for the output node to discharge is a function of the size of the isolation transistor. In order to obtain a short discharge time, the isolation transistor must be relatively large. However, the isolation transistor cannot be too large because the larger the isolation transistor, the greater the capacitance of the output circuit and, hence, the higher the discharge time.

With the size of the isolation transistor selected for maximum speed, it becomes evident that the isolation transistor is too large to permit maximum circuit density if one isolation transistor is provided for each stack. I have therefore designed the circuit such that the driver transistor concentration is enhanced by utilizing a single isolation transistor for multiple columns of series connected driver transistors.

This is accomplished by interposing column selection decode transistors between the isolation transistor and multiple stacks. These decode transistors select, in accordance with selection signals, a single one of the stacks for connection to the isolation transistor. In this manner, both high speed and high density are achieved simultaneously.

Contact holes in the material of which the circuit is fabricated take up space on the chip which otherwise could be devoted to memory. Such contact holes are required, for example, to connect the output of the stacks of driver transistors to the output line which, in turn, is connected to the sense amplifier. Normally, a contact hole must be provided for each stack.

However, in the present invention, I have devised a circuit structure which eliminates the necessity for many of the contact holes normally required to connect the stacks to the output line. By fabricating a portion of the column selection circuit, namely, the column selection decode transistors, on the chip adjacent the memory array, only a single contact hole is required for each group of stacks. Eliminating many of the contact holes significantly enhances the compactness of the memory.

It is, therefore, a prime object of the present invention to provide a highly compact read only memory with significantly reduced access time.

It is another object of the present invention to provide a read only memory wherein the number of contact holes is reduced.

It is another object of the present invention to provide a compact read only memory wherein the column selection decode transistors are fabricated on the chip adjacent the memory array.

It is another object of the present invention to provide a compact read only memory, wherein only a single connection to the output line is required for each group of stacks.

It is another object of the present invention to provide a compact read only memory, wherein the column selection decode circuit comprises an array of depletion mode and enhancement mode transistors.

It is another object of the present invention to provide a compact read only memory with reduced access time wherein the relatively high impedance circuit formed by the series connected driver transistors is isolated from the relatively high capacitive load of the output.

It is another object of the present invention to provide a compact read only memory with reduced access time wherein the number of transistors in each series connected circuit can be increased without resulting in significantly increased delay times.

It is another object of the present invention to provide a compact read only memory with reduced access time wherein a single isolation transistor is utilized to isolate the selected stack from the output.

It is another object of the present invention to provide a compact read only memory with reduced access time wherein the control node associated with the isolating transistor is charged using a switched ground technique.

It is another object of the present invention to provide a compact read only memory with reduced access time wherein the density of the memory is increased by providing only a single isolation transistor for a plurality of stacks.

In accordance with one aspect of the present invention, the read only memory consists of a source of first potential, a control node, an output node normally maintained at a relatively high potential, and a plurality of driver transistors. Each driver transistor has a control terminal and an output circuit. The output circuits of the driver transistors are operably connected in series between the source and the control node, to form a relatively high impedance circuit. The output node is connected to a relatively high capacitive load. Means are provided for selecting a driver transistor and for applying a select signal to the control terminal thereof and non-select signals to the control terminals of the non-selected driver transistors, respectively. Means are provided for operatively isolating the control node from the output node. The isolation means is effective, when actuated, to prevent the output node from being discharged. Means are provided for charging the control node to a potential higher than the first potential, prior to the application of the select and non-select signals. The isolation means comprises an isolation transistor having its control terminal connected to the control node such that the isolation transistor is actuated only if the control node is operably connected to the first potential, through the driver transistors, when the select and non-select signals are applied. The output circuit of the transistor is connected between ground and the output node to discharge the output node, if the isolation transistor is actuated.

Preferably, the control node charging means comprises a switched ground source capable of supplying the first potential and a second potential to the control node, at the appropriate times. The second potential is applied to the control node prior to the application of the select and non-select signals to precharge the control node and render the isolation transistor conductive. During the time when the select and non-select signals are applied, the source switches to the first potential, preferably ground.

Means are provided between the switched ground source and the control node to prevent the control node from discharging to the first potential, through the switched ground source, when the source is at the first potential. Thus, if all of the series connected driver transistors are rendered conductive by the select and non-select signals, the control node will discharge, through the driver transistors, to the first potential and the output node will be isolated from the first potential by the non-conductive output circuit of the isolation transistor. Otherwise, the control node will maintain its charge and the output node will remain connected to the first potential, discharging same, because the isolation transistor will remain conductive.

A further refinement may be achieved by connecting the series connected driver circuit between the control node and the switched ground source, instead of the source of first potential. The effect is the same when the drivers are addressed because the switched ground source is at the first potential during this period. However, during the control node charging period, prior to the application of the select and non-select signals, the switched ground source is at the second potential to charge the control node. If all of the drivers are rendered conductive during the control node charging period, the second potential from the switched ground source will also be applied to the control node through the series connected drivers and, thus, tend to reinforce the charge on the control node.

Since the relatively high impedance circuit, formed by the large number of series connected driver transistors, is isolated from the high capacitive load of the output by the isolation transistor, the delay time is significantly reduced. Circuits, 48 transistors long, have been tested. Thus, it is expected that the present invention will permit the fabrication of large capacity read only memories with access times of about 200-300 nanoseconds, on a commercial scale.

In order to increase the density of the memory circuit, several stacks of series connected driver transistors are connected to a single isolation transistor through a circuit designed to select one of the stacks for accessing, in accordance with address signals. Each of these groups of stacks, and the selection circuit therefor, are referred to herein as a "page." For further economy of space, two pages may be associated with each isolation transistor. Page select means are utilized to select one of the pages for connection to the isolation transistor. Thus, the address signals comprise page address signals, stack (column) address signals, and bit (row) address signals. The appropriate application of the address signals will permit accessing a single designated driver transistor.

In this manner, the relatively large isolation transistor, required for fast discharge of the output node, is associated with multiple stacks of series connected driver transistors. This substantially reduces the size of the circuit without any sacrifice in speed.

In accordance with a second aspect of the present invention, apparatus is provided for selecting a column of memory units in accordance with column select signals. The apparatus includes an output node and four tiers of transistors, operably connected between the output node and the columns of memory units. The first and second tiers include four transistors each. The third and fourth tiers include two transistors each. Each transistor comprises a control terminal and an output circuit. All of the control terminals of the transistors in each tier are connected to receive a different one of the column select signals. The output circuit of each transistor in the first tier is operably connected between one of the columns and the output circuit of a different one of the transistors in the second tier. The output circuits of the transistors of the third tier are operably connected between the output circuits of a transistor in the fourth tier and a node joining the output circuits of an adjacent pair of transistors in the second tier. The output node is operably connected to the output circuits of the transistors in the fourth tier.

The first and third transistors in the first tier, the second and fourth transistors in the second tier, the first transistor in the third tier, and the second transistor in the fourth tier are depletion node transistors. The remaining transistors are enhancement mode transistors.

The apparatus further comprises an output line and means for operably connecting said output node to said output line. The connecting means comprises an isolation transistor having a control terminal and an output circuit. The control terminal is operably connected to the output node. Means are provided for precharging the output node to render the isolation transistor conductive. The isolation transistor output circuit is operably connected between the output line and a source of reference potential.

Each of the columns comprises a plurality of series connected driver transistors which are effective, when rendered conductive in the presence of the appropriate column select signals for that column, to disspate the charge on the output node, thereby rendering the isolation transistor non-conductive.

The output line is normally maintained at a first voltage level. However, when the isolation transistor is conductive, the output line is operably connected through the isolation transistor to the source of reference potential.

A sense amplifier is operably connected to the output line. The sense amplifier is capable of detecting whether all of the driver transistors in a selected column have been rendered conductive.

The fabrication of the column select decode circuit on the chip adjacent the columns of memory units permits each group of columns to be connected to the output line through a single contact hole. The necessity of a contact hole for each column is eliminated, thereby enhancing the compactness of the memory.

To the accomplishment of the above and to such other objects as may hereinafter appear, the present invention relates to a compact read only memory having reduced access time, as described in detail in the following specification and recited in the annexed claims, taken together with the accompanying drawings, wherein like numerals refer to like parts and in which:

FIG. 3 is a block diagram of a read only memory employing the present invention;

Figure 1:
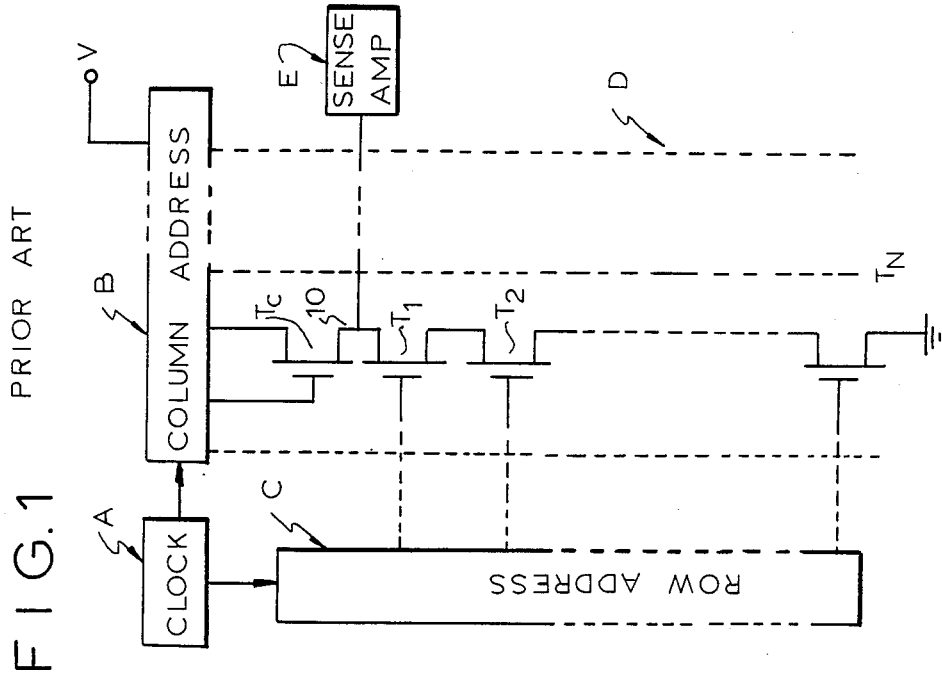
FIG. 1 is a schematic diagram of the Kawagoe/Tsuji read only memory circuit described in the article referred to above.

FIG. 1 is a schematic representation of the Kawagoe/Tsuji memory disclosed in the above-mentioned article. The memory comprises a timing circuit or clock, generally designated A, which is connected to a column address circuit, generally designated B, and a row address circuit, generally designated C. A matrix array of silicon gate semiconductor transistors, generally designated D, comprises a plurality of columns (only one of which is shown in detail) connected, respectively, to the outputs of column address circuit B. A plurality of row buses are connected to the respective outputs of row address circuit C. A separate sense amplifier, generally designated E, is provided for and connected to each column of the matrix D.

Each column of the matrix D comprises a plurality of P-channel transistors T, each having a control terminal and an output circuit. The output circuits of each of the transistors T are connected in series between ground and an output of column address circuit B. The first or topmost transistor T is designated as $T_C$ because the control terminal thereof is connected to the high level output of clock A, through column address circuit B. The other transistors in the column which act as drivers are designated $T_1, T_2 \ldots T_n$, respectively. Transistor $T_C$ acts as a load for driver transistors $T_1, T_2 \ldots T_n$. The control terminals of each of the driver transistors $T_1, T_2 \ldots T_n$ are, respectively, connected to row address circuit C. In this manner, a cascade ratioless circuit is formed.

Transistor $T_C$ is an enhancement mode transistor. The driver transistors $T_1 \ldots T_n$ consist of either enhancement mode or depletion mode transistors, depending upon the information to be defined thereby. When a particular column is selected by column address circuit B, the output circuit of load transistor $T_C$ is connected to a voltage source V and clock A applies a high signal to the control terminal of transistor $T_C$ so as to render same conductive. In this manner, output node 10 is charged to a level close to the level of a negative source V. The clock signal is then removed from the control terminal of transistor $T_C$ such that transistor $T_C$ is rendered non-conductive and output node 10 is isolated and, thus, remains charged. Row address circuit C is then actuated to apply a select signal to the control terminal of the selected driver transistor and non-select signals to the control terminals of each of the non-selected transistors, respectively. Preferably, the select signal is a relatively high level (near zero volts), and the non-select signals are of a relatively low level (negative).

For example, assume Transistor $T_2$ is selected and that transistor $T_2$ is a deplation mode transistor. Transistor $T_2$ remains conductive when the high level (zero) select signal is applied thereto. The non-selected enhancement mode transistors, in series with the selected transistor, are turned on by the low (negative) level of the non-select signals applied to their respective control terminals. The non-selected deplation mode transistors remain conductive. Thus, the output level to sense amplifier E is high (near zero volts) because the precharged output node 10 is discharged through the output circuits of transistors $T_1, T_2 \ldots T_n$ to a potential close to ground.

On the other hand, assume transistor $T_3$ is selected and that transistor $T_3$ is an enhancement mode transistor and, thus, normally non-conductive. The control terminal of transistor $T_3$ receives the select signal, whereas the control terminals of all of the other transistors, respectively, receive the non-select signals. The application of the select signal to the control terminal of transistor $T_3$ retains transistor $T_3$ in the non-conductive state. Thus, the output level applied to the input of sense amplifier E is low (negative) because there is no discharging path for the precharged data node 10.

It should be noted that the Kawagoe/Tsuji circuit requires a separate connection between the output node of each column and the sense amplifier. Thus, a contact hole is required for each column. The large number of contact holes required substantially increases the amount of chip space required for the circuit.

Figure 2:
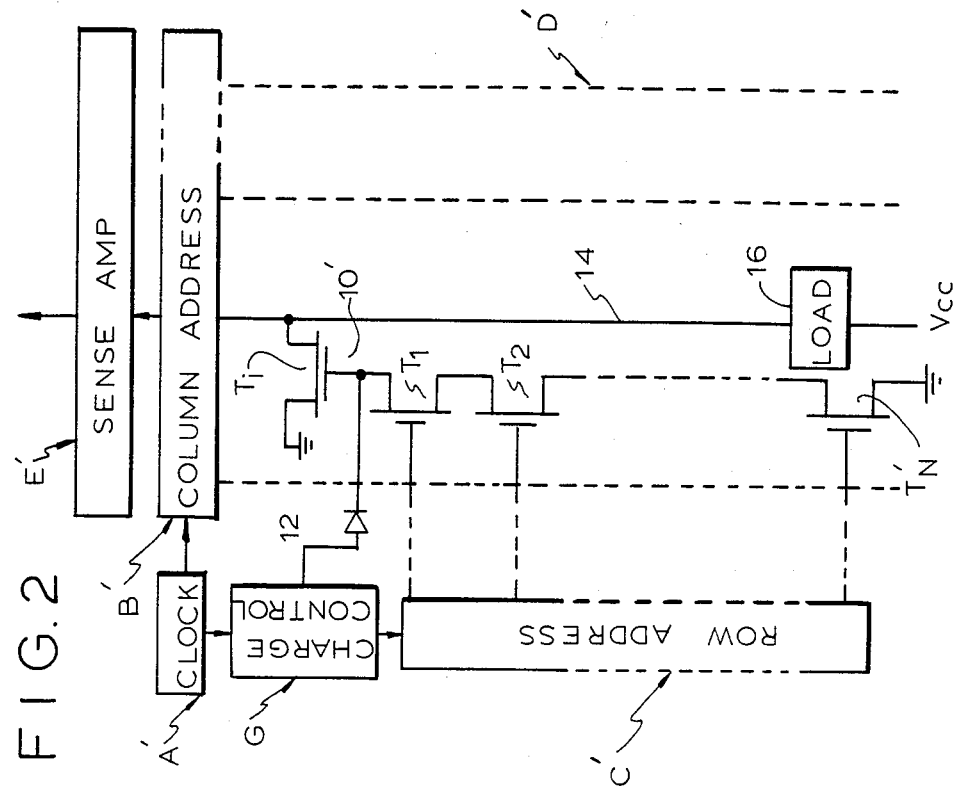
FIG. 2 is a diagram showing the basic concept of the read only memory circuit of the present invention.

FIG. 2 schematically depicts one of the basic concepts of the improved read only memory circuit of the present invention. Where appropriate for comparison purposes, the same legend used in FIG. 1 is employed with a prime (') to designate a corresponding item in FIG. 2. The memory consists of a timing circuit or clock A', a column address circuit B', a row address circuit C', a memory transistor matrix array D', and a sense amplifier E', similar to those described with respect to FIG. 1. Again, only a single column is shown for clarity. In this case, a charging control circuit, generally designated G, employs a switch ground technique to generate high and low signals in the proper timed sequence. Circuit G is connected to control node 10' through a diode 12 and, prior to application of the address signals, applies a high signal to node 10' to precharge same. Column selection circuit B' connects the selected output line 14 to the input of sense amplifier E'. Line 14 is connected to a source $V_{CC}$ through load 16 and, thus, will be at a level near $V_{CC}$, unless discharged.

In accordance with the present invention, transistor $T_C$, which is the first transistor in each column of matrix D, as shown in FIG. 1, has been replaced by an isolation transistor $T_i$ which has a control terminal connected through control node 10' to the series connected output circuits of transistors $T'_1, T'_2 \ldots T'_n$ and an output circuit which is connected between ground and column output line 14. Transistor $T_i$ is an enhancement mode transistor and, therefore, is normally non-conductive. However, the application of a high signal on node 10', from charge control circuit G, renders transistor $T_i$ conductive so as to connect line 14 to ground. Transistors $T_1, T_2 \ldots T_n$ are either depletion mode or enhancement mode, N-channel transistors, depending upon the information defined thereby.

When the row and column select signals are applied, the output of charging control circuit G changes from high to low. However, control node 10' remains charged because diode 12 prevents the charge thereon from dissipating through control circuit G.

The row select signals include select signals which are low level (in this case, near zero volts) and non-select signals which are high level (in this case, positive). A select signal is applied to the control terminal of the driver transistor in the selected row while the control terminals of all of the other transistors receive the non-select signals.

If the select signal is applied to a depletion mode transistor, it remains conductive, the non-selected enhancement mode driver transistors are rendered conductive, and the non-selected depletion mode driver transistors remain conductive. Hence, control node 10', and thus the control terminal of transistor $T_i$, are connected to ground, turning transistor $T_i$ off so as to prevent the discharging of the output line 14 to ground through the output circuit of transistor $T_i$. Thus, sense amplifier E detects a high level output.

On the other hand, if an enhancement mode transistor is selected, this transistor will remain non-conductive, thus preventing control node 10' from discharging, and thus the control terminal of transistor $T_i$ from being connected to ground through the series connected output circuits of the driver transistors. In this case, transistor $T_i$ remains conductive and output line 14 is discharged to ground. Thus, sense amplifier E detects a low level input.

As illustrated in FIG. 2, each column or stack of the memory circuit is provided with a single isolation transistor $T_i$. However, the isolation transistor $T_i$ must be larger than the driver transistors in order to achieve the desired speed. It is therefore possible to significantly enhance the density of the memory circuit by using a single isolation transistor for multiple stacks or columns. The manner in which this is accomplished is described below and is the preferred form of the present invention.

It will be appreciated that transistor $T_i$ functions to isolate the series connected driver transistors $T'_1 \ldots T'_n$ from the output node 10'. This is important because the series connected driver transistors form a circuit with a relatively high impedance, because of the large number thereof. Since the output line 14 is connected to a relatively high capacitive load, connecting the output circuit directly to the series connected driver transistors would result in a relatively long discharge time for line 14. This problem is eliminated in the present invention, in order to significantly reduce the delay time, by isolating or buffering the output line 14 from the series connected driver transistors by means of transistor $T_i$. In addition, it will be appreciated that transistor $T_i$ is connected so that it also serves to provide a second function, that is, output line 14 is discharged through its output circuit if the selected driver transistor is rendered conductive.

Further, by isolating the driver transistor circuit from the output load, the number of transistors in the driver transistor circuit may be increased without significantly increasing the delay time. Thus, the size of the memory is no longer restricted as it is in the Kawagoe/Tsuji circuit.

Although FIG. 2 schematically depicts column address circuit B' as being located between the output line 14 and sense amplifier E' for simplicity, in its preferred form, a portion of this circuit, the column address decode circuit, is interposed between the output node 10' and a group of columns which share the output node and the isolation transistor. The structure of the column address decode circuit is described in detail below and depicted in FIG. 4.

By placing the column address decode circuit between the output node and the column groups, column selection is performed on the chip itself, thereby eliminating the necessity for having a separate connection between each column and the sense amplifier. This scheme significantly reduces the number of contact holes and, thus, enhances the compactness of the memory.

FIG. 3 is a block diagram of a simplified read only memory employing the present invention. The read only memory depicted in FIG. 3 shows only a two bit memory. However, it should be understood that the memory can be expanded to include larger numbers of bits by simple duplication of parts, same being well within the ordinary skill in the art.

The matrix D' of memory cells is shown as comprising four separate sub-matrices, $D'_1 \ldots D'_4$, each represented by a rectangular box. Each pair of vertically aligned submatrices D contains the information for one memory bit. Each of the boxes D' contains four sub-divisions $R_1 \ldots R_4$. Each sub-division $R_1 \ldots R_4$, in turn, contains four pages, $P_1 \ldots P_4$ as described in detail below.

Each page P includes four parallelly situated columns or stacks, each of the columns or stacks comprising a plurality of series connected driver transistors $T'_1 \ldots T'_n$, which may either be enhancement mode or depletion mode transistors, depending upon the information contained therein. Each page P also contains column selection means and page select means. The column select means is designed to select a single column or stack and to connect same, through a page select means, to the control terminal of an isolation transistor $T_i$, when the page select means is actuated.

Within each sub-division R of each sub-matrix $D'_1 \ldots D'_4$, there are two side-by-side pairs of vertically aligned pages P. The stacks in each vertically aligned page pair are operably connected, through their respective page select means and column select means, to a single control node 10'. The control node 10' is, in turn, connected to the control terminal of a single isolation transistor $T_i$. The output circuit of the isolation transistor $T_i$ is connected between ground and the column output line 14 provided for the vertically aligned page pair.

The peripheral circuitry includes a plurality of chip inputs $Q_1 \ldots Q_n$, each of which is connected to a different one of a plurality of input buffer circuits, respectively, which, in aggregate, are generally designated H. Each one of the input buffer circuits H has two outputs (only one of which is shown), generating separate but complementary signals, based on its input.

The outputs of one of the input buffer circuits H are applied to the input of a page address circuit, generally designated I. The page address circuit I receives complementary input signals and generates a pair of page select signals to each sub-division R in each set of horizontally aligned sub-matrices D'. Similarly, two of the input buffer circuits H are connected to the input of column address circuit 16. The two pairs of complementary outputs from column address circuit 16 are connected to each page P of each sub-division R in each set of horizontally aligned sub-matrices D' and serve to select one of four columns or stacks in the page. Row address circuit C' is also connected to the outputs of seven of the input buffer circuits H. In accordance with the complementary output signals from these input buffer circuits H, row address circuit C, which has a plurality of output lines, one for each driver transistor in each vertically aligned page P of each sub-division R of each set of horizontally aligned sub-matrices D', generates the select signal to the selected row and non-select signals to all other rows.

Figure 5:
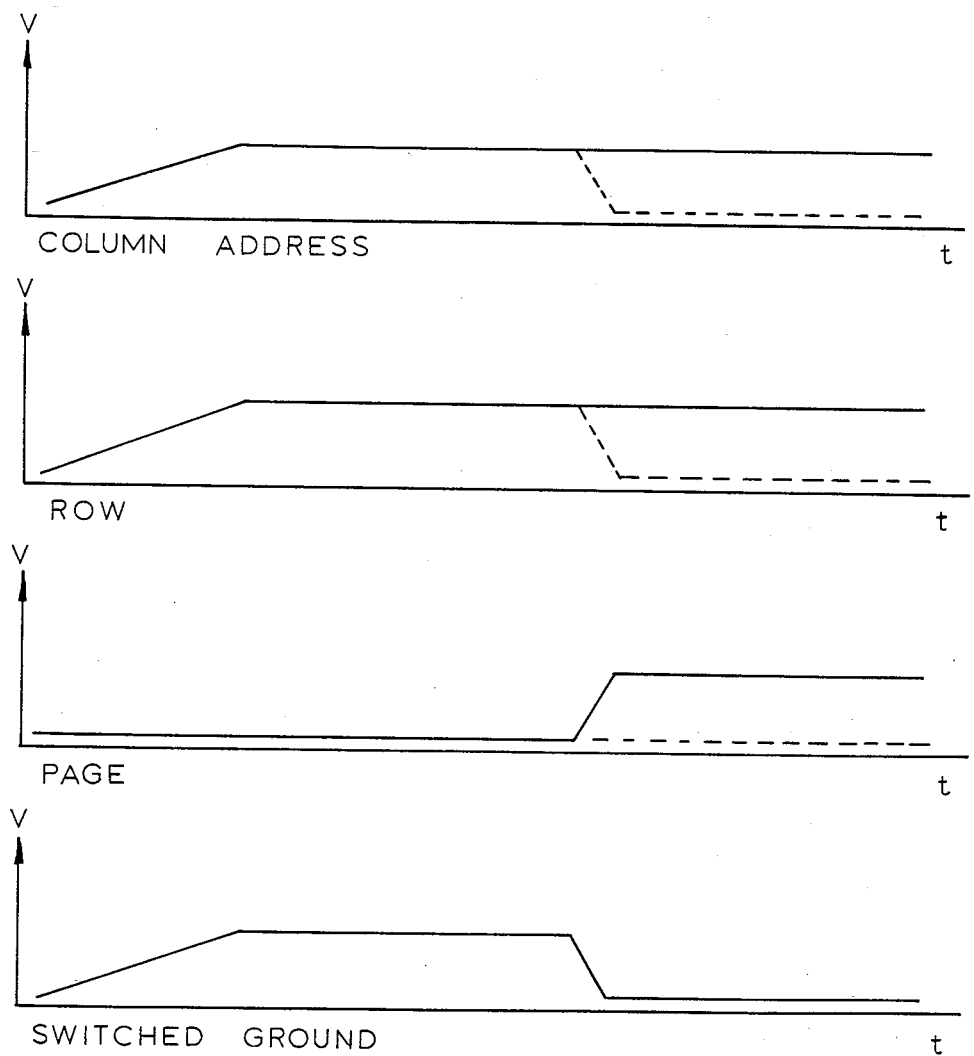
FIG. 5 is a timing diagram for the address and switched ground signals utilized in the memory illustrated in FIGS. 3 and 4.

The switched ground driver circuit G is connected to the output of two of the input buffer circuits H to receive two pairs of complementary inputs, and generates a switched ground output to all vertically aligned subdivisions R in each set of vertically aligned sub-matrices D'. The switched ground output and all column and row address output signals will be high prior to addressing, whereas the page address output signals will all be low prior to addressing, as illustrated in FIG. 5.

Each pair of vertically aligned pages in each sub-division R is provided with a column output line 14 which is connected between a load circuit 18 and an output line decoder circuit 20. Vertically aligned sub-divisions R share the same output lines 14. Each column output line 14 is connected through load 18 to a source of positive potential $V_{CC}$. Thus, all output lines 14 are normally at a positive potential.

An output line decoder circuit 20 is provided for each bit. Output line decoder circuits 20 are connected to one of the input buffer circuits H and function to connect a selected column output line 14 to one of four sense amplifiers in each sense amplifier circuit E', one of which is provided for each bit.

Each sense amplifier in each circuit E' is thus associated with one set of vertically aligned sub-divisions R in each of the vertically aligned sub-matrices D'. All of the four sense amplifiers in each of the circuits E' are connected to a single output buffer 22 for that bit.

Figure 4:
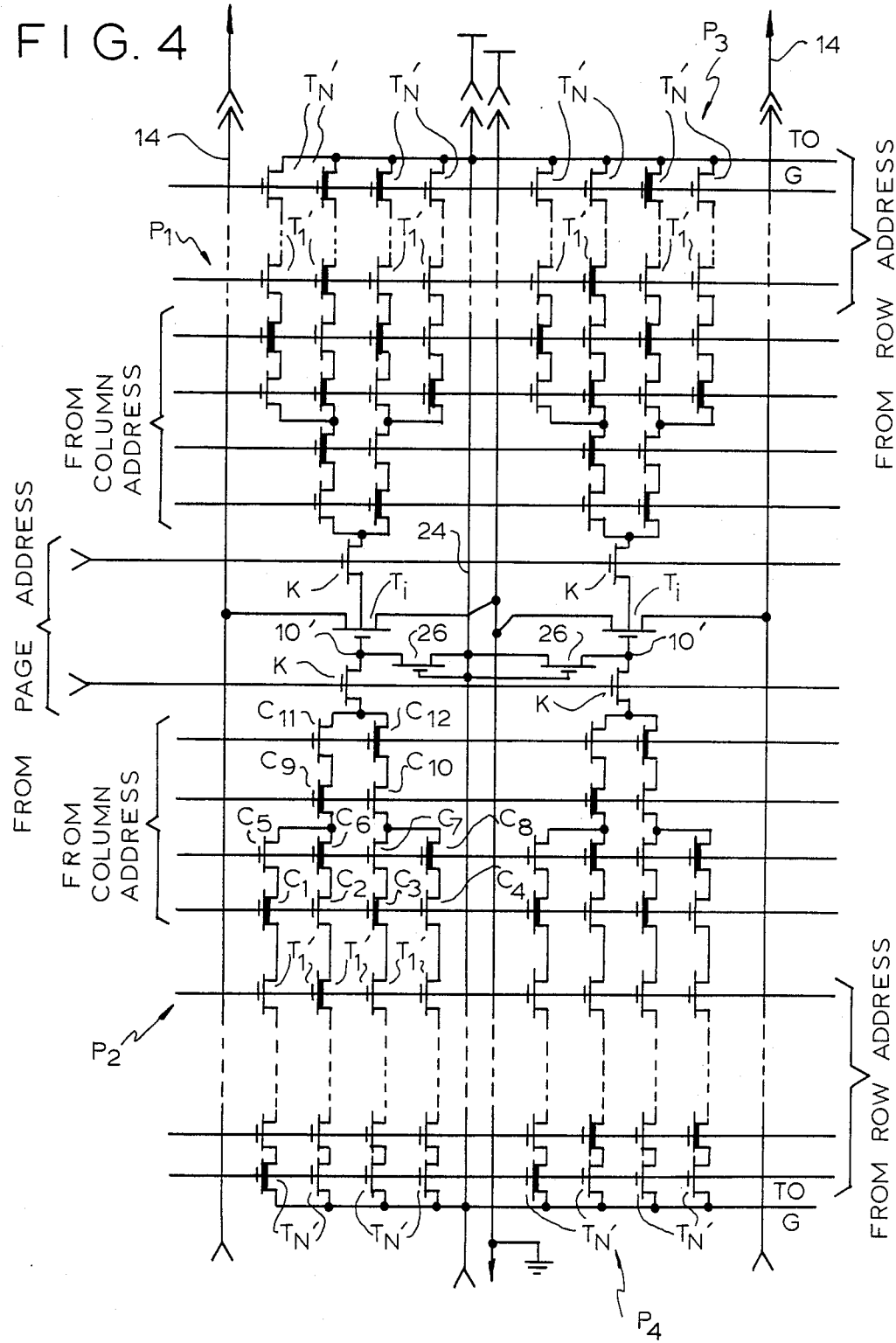
FIG. 4 is a schematic diagram of a portion of one of the memory arrays shown in FIG. 3.

The specific structure of each of the sub-divisions R can best be appreciated by referring to FIG. 4, which illustrates a typical sub-division R. FIG. 4 shows two pairs of vertically aligned pages $P_1 \ldots P_4$. Each page P comprises four parallel columns or stacks of series connected driver transistors $T'_1 \ldots T'_n$. Driver transistors $T'_1 \ldots T'_n$ are either enhancement mode or depletion mode transistors in accordance with the information to be contained in the memory. Throughout the figure, enhancement mode transistors are depicted as comprising a thin body portion and depletion mode transistors are depicted as comprising a thick body on the diagram.

Each of the four columns or stacks of driver transistors in each page P are connected between the output of switched ground driver circuit G and a column select means. Each of the column select means comprises a column select decode circuit including four horizontal rows or tiers of transistors, each row receiving a different output from column address circuit 16. The horizontal row or tier of column select transistors nearest the columns or stacks each consist of a depletion mode transistor $C_1$, an enhancement mode transistor $C_2$, a depletion mode transistor $C_3$, and an enhancement mode transistor $C_4$. The respective output circuits of transistors $C_1 \ldots C_4$ are connected between one of the columns or stacks on the one hand, and the transistors $C_5$ through $C_8$ on the other hand, which form the next row or tier of the column select decode circuit. Transistor $C_5$ is an enhancement mode transistor, transistor $C_6$ is a depletion mode transistor, transistor $C_7$ is an enhancement mode transistor, and transistor $C_8$ is a depletion mode transistor.

The next horizontal row or tier of transistors in the column select decode circuit consists of two transistors $C_9$ and $C_{10}$. Transistor $C_9$ is a depletion mode transistor and transistor $C_{10}$ is an enhancement mode transistor. The output circuit of transistor $C_9$ is connected through an intermediate node to the output circuits of both transistors $C_5$ and $C_6$. Similarly, the output circuit of transistor $C_{10}$ is connected through a second intermediate node to the output circuits of transistors $C_7$ and $C_8$.

The fourth and last horizontal row or tier of column select transistors comprises two transistors $C_{11}$ an $C_{12}$. The output circuit of transistor $C_{11}$ is connected between the output circuit of transistor $C_9$ and the output circuit of an enhancement mode page select transistor K. The output circuit of transistor $C_{12}$ is connected between the output circuit of transistor $C_{10}$ and the output circuit of page select transistor K.

The output circuit of page select transistor K is connected between the column select decode circuit and control node 10' which, in turn, is connected to the control terminal of the isolation transistor $T_i$, one of which is provided for each pair of vertically aligned pages P. Control node 10' is operably connected to the output of the switched ground driver circuit G through line 24 and a transistor 26. Transistor 26 has its control terminal also tied to the output of switched ground driver circuit G, via line 24, and thus functions as a diode similar to diode 12 shown in FIG. 2.

Prior to addressing, the output of switched ground driver circuit G is high such that control node 10' is charged to a high level through transistor 26. All page address signals are low. All column and row address signals are high. When all of the row address signals are high, all driver transistors are conductive, thereby connecting the output circuits of column select transistors $C_1$ through $C_4$ to the output of switched ground driver G through the respective stacks. When all of the column address signals are high, all of the stacks are connected to page select transistor K. At this point, any feed through page select transistor K would tend to dissipate the charge on control node 10' if transistor $T'_n$ of each stack were not connected to a source of high potential. It is for this reason that transistor $T'_n$ in each stack is connected to the output of switched ground driver G which is, during this period, at a high potential.

The output of switched ground driver circuit G now changes to a low level (ground) such that the end of each stack is connected to ground. However, the charge on control node 10' cannot dissipate through the switched ground driver circuit G because of transistor 26 which acts as a diode to prevent same. As the output of circuit G switches, the page, column and row select signals, and the output line decoder signals are generated and applied.

The selection process serves to select a row, a page, and to operably connect a selected stack or column in the selected page with the control node 10' associated with the selected page. For example, suppose the third driver transistor $T_3$ in the third column of page $P_2$, which appears on the lower lefthand corner of FIG. 4, is to be selected. A row select signal is applied to the third output line from row address circuit C'. All other row address output lines receive non-select signals. The page select signal applied to the page select transistors K for all pages in the lower half of all of the horizontally aligned sub-matrices D' will be high so as to render the corresponding page select transistors K conductive. The outputs on all other page select inputs will be low, keeping all other page select transistors K non-conductive, thereby disconnecting those pages from the corresponding control nodes 10'.

Four separate column select signals are applied to the four separate column select lines associated with the selected pages. In order to select the third column or stack of the page, the column select signal applied to column select transistors $C_1 \ldots C_4$ will be low, causing transistors $C_1$ and $C_3$ to remain conductive and transistors $C_2$ and $C_4$ to be non-conductive. The column select signal applied to the control terminals of column select transistors $C_5 \ldots C_8$ will be high such that transistors $C_5$ and $C_7$ will be rendered conductive and transistors $C_6$ and $C_8$ rendered non-conductive. The column select signal applied to the control terminals of transistors $C_9$ and $C_{10}$ will be high, thereby rendering transistor $C_9$ non-conductive and transistor $C_{10}$ conductive. The column select signal applied to the control terminals of transistors $C_{11}$ and $C_{12}$ will be low, such that transistor $C_{11}$ is turned off and transistor $C_{12}$ is turned on. Thus, column select transistors $C_3$, $C_7$, $C_{10}$ and $C_{12}$ will all be rendered conductive by the column select signals, thereby connecting the third column or stack, through conductive page select transistor K, with control node 10'.

The select row address signal applied to the control terminal of driver transistor T₃ is a low level signal and the non-select signals are high level signals. Thus, if the select signal is applied to a depletion mode transistor, the non-selected enhancement mode transistors are rendered conductive (non-selected depletion mode transistors remain conductive), and control node 10' is operably connected to the output of switched ground driver circuit G, which is ground, through the selected page select transistor K, the selected column select transistors C₃, C₇, C₁₀ and C₁₂, and the series connected driver transistors in the selected column or stack. In this way, the charge on control node 10' will dissipate through the switched ground driver circuit G, causing isolation transistor $T_i$ to become non-conductive. When isolation transistor $T_i$ becomes non-conductive, the column output line 14 associated with that isolation transistor becomes isolated from line 24 and, thus, from ground and thereafter rapidly charges to a positive potential, near $V_{CC}$, through load 18.

If, on the other hand, the selected driver transistor T₃ were an enhancement mode transistor, the application of the low level select signal thereto would not render same conductive. Therefore, the control node 10' would continue to be isolated from the grounded output of switched ground driver circuit G, control node 10' would maintain its charge, isolation transistor $T_i$ would continue to be conductive and function to connect the column output line 14 to ground, via line 24, preventing line 14 from charging to near the positive $V_{CC}$ level, through load 18.

Each of the column output lines 14 is connected through output line decoder circuit 20 to one of the sense amplifiers in sense amplifier circuit E'. Output line decoder circuit 20 is operably connected to the output of one of the input buffer circuits H, which causes the output line decoder circuit 20 to select only the column output line 14 of interest for connection to the corresponding sense amplifier in sense amplifier circuit E'. In this case, the column output line 14 of interest is the line shown on the lefthand side of FIG. 4. Thus, column output line 14 is connected through column decoder circuit 20 to the sense amplifier shown at the left of sense amplifier circuit E'. The sense amplifier senses whether the column output line 14 of interest is at a high level signal or a low level signal, after page, column and row selections have taken place. The sense amplifier generates a signal which is a function of the state of the sensed level on output line 14 and applies same to an output buffer circuit 22. Circuit 22 latches the output, by means of a bistable circuit and generates either a high or low level signal to represent the output of the addressed bit. Since the output buffer serves to latch the output signal corresponding to each bit, each bit in the memory can be addressed in sequence in order to read out a data word having a plurality of bits therein.

It will now be appreciated that by fabricating the column select decoder transistors C₁ through C₁₂ as part of the array, between the columns and the output node, only a single connection between the group of columns and the output line is required. This reduces the number of contact holes and enhances the compactness of the circuit.

FIG. 5 graphically illustrates the time relationship between the column address, row address, page address and switched ground signals. Each graph shows magnitude plotted against time.

Prior to addressing, the column address and row address signals are all positive. Thus, all driver transistors and column select transistors are conductive. The switched ground signal is also positive prior to addressing, during the period when the control node is charged. The page address signals are, however, low during this period.

The page address signals are kept low during precharge to prevent any dissipation of charge from the control node through the stacks, which are conductive. However, even if some feed through the page select transistors should occur prior to addressing, dissipation of charge through the stack is prevented because the switched ground signal, also high during precharge, is connected to the far end of each stack.

When address occurs, the column address signals will remain high or become low, depending upon the column selected. The row address signals become low (select), or remain high (non-select). Page address signals either remain low or change to high.

The switched ground signals alternate between high, for control node precharge, and low, during addressing and information read-out. During the low period, control node charging ceases (but discharge through the switched ground driver is prevented) and discharge through the far end of each stack is possible.

It will now be appreciated that the present invention permits the fabrication of a read only memory having high density, rapid access time, and large capacity. Large capacity is obtained by isolating the high impedance stacks from the high capacitive load such that long stacks may be used without increasing the delay time significantly. High speed is achieved by using relatively large isolation transistors to permit rapid changes in the potential level of the output lines. High density results from the use of a single isolation transistor and a single contact hole for multiple stacks. This is achieved through the use of a column select decode circuit situated adjacent the memory array and interposed between the isolation transistor and the columns. Thus, the present invention represents a significant improvement over the prior art in these three very important aspects.

While only a single preferred embodiment of the present invention has been disclosed herein for purposes of illustration, it is obvious that many variations and modifications could be made thereto. It is intended to cover all of these variations and modifications which fall within the scope of the present invention, as defined by the following claims.

I claim:

1. Apparatus for selecting a column of memory units in accordance with column select signals comprising an output node and four tiers of transistors, operably connected between said output node and the columns of memory units, said first and second tiers comprising four transistors each, said third and fourth tiers comprising two transistors each, each of said transistors comprising a control terminal and an output circuit, all of said control terminals of the transistors in each of said tiers being connected to receive a different one of said column select signals, the output circuit of each transistor in said first tier being operatively connected between one of said columns and the output circuit of a different one of said transistors in said second tier, the output circuits of the transistors in said third tier being operably connected between the output circuit of a transistor in said fourth tier and a node joining the output circuits of an adjacent pair of transistors in said second tier, said output node being operably connected to the output circuits of the transistors in said fourth tier.

2. The apparatus of claim 1, wherein said first and third transistors in said first tier, the second and fourth transistors in said second tier, the first transistor in said third tier, and the second transistor in said fourth tier being depletion mode transistors and the remaining transistors being enhancement mode transistors.

3. The apparatus of claim 1, further comprising an output line, means for operably connecting said output node to said output line comprising an isolation transistor having a control terminal and an output circuit, said control terminal being operably connected to said output node, means for precharging said output node to render said isolation transistor conductive, said isolating transistor output circuit being operably connected between said output line and a source at a reference potential.

4. The apparatus of claim 3, wherein each of said columns comprises a plurality of series connected driver transistors which are effective, when rendered conductive in the presence of the appropriate column select signals for that column, to dissipate the charge on said output node, thereby rendering said isolation transistor non-conductive.

5. The apparatus of claim 4, wherein said output line is normally maintained at a first voltage level and wherein said output line is operably connected to said source of reference potential when said isolation transistor is conductive.

6. The apparatus of claim 5, further comprising a sense amplifier operably connected to said output line and capable of detecting whether all of the transistors in the selected column have been rendered conductive.

7. Apparatus for selecting a column of memory units in accordance with column select signals comprising an output node and a decode circuit comprising three sets of four transistors each, said decode circuit being operably connected between said output node and the column of memory units, each transistor in said sets comprising a control node and an output circuit, each set comprising two parallel pairs of series connected transistors, one transistor in each pair being an enhancement mode transistor and the other being a depletion mode transistor, first and second intermediate nodes, each pair of transistors in said first and second sets being operably connected between a different column and one of said intermediate nodes, each pair of transistors in said third set being connected between a different one of said intermediate nodes and said output node, one transistor in each of said pairs in each of said first and second sets being operably connected to receive a first selection signal, the other transistor in each of said pairs in each of said first and second sets being operably connected to receive a second selection signal, one transistor in each of said pairs in said third set being operably connectable to receive a third selection signal and the other transistor in each of said pairs in said third set being connectable to receive a fourth selection signal.

8. The apparatus of claim 7, further comprising an output line, means for operably connecting said output node to said output line comprising an isolation transistor having a control terminal and an output circuit, said control terminal being operably connected to said output node, means for precharging said output node to render said isolation transistor conductive, said isolating transistor output circuit being operably connected between said output line and a source at a reference potential.

9. The apparatus of claim 8, wherein each of said columns comprises a plurality of series connected driver transistors which are effective, when rendered conductive in the presence of the appropriate column select signals for that column, to dissipate the charge on said output node, thereby rendering said isolation transistor non-conductive.

10. The apparatus of claim 9, wherein said output line is normally maintained at a first voltage level and wherein said output line is operably connected to said source of reference potential when said isolation transistor is conductive.

11. The apparatus of claim 10, further comprising a sense amplifier operably connected to said output line and capable of detecting whether all of the transistors in the selected column have been rendered conductive.

* * * * *